United States Patent
Yang

[11] Patent Number: 6,030,731
[45] Date of Patent: Feb. 29, 2000

[54] METHOD FOR REMOVING THE CARBON HALO CAUSED BY FIB CLEAR DEFECT REPAIR OF A PHOTOMASK

[75] Inventor: Baorui Yang, Pflugerville, Tex.

[73] Assignee: Micron Technology, Inc., Boise, Id.

[21] Appl. No.: 09/190,057

[22] Filed: Nov. 12, 1998

[51] Int. Cl.$^7$ ........................................................ G03F 9/00
[52] U.S. Cl. .......................................... 430/5; 204/192.35
[58] Field of Search ................................. 430/5, 22, 322; 204/192.33, 192.34, 192.35

[56] References Cited

U.S. PATENT DOCUMENTS

| | | | |
|---|---|---|---|
| 4,851,097 | 7/1989 | Hattori et al. | 204/192.33 |
| 5,085,957 | 2/1992 | Hosono | 430/5 |
| 5,165,954 | 11/1992 | Parker et al. | 427/526 |
| 5,272,116 | 12/1993 | Hosono | 437/228 |
| 5,357,116 | 10/1994 | Talbot et al. | 250/492.21 |
| 5,717,204 | 2/1998 | Meisburger et al. | 250/310 |

OTHER PUBLICATIONS

Stark, T.J., et al., *H$_2$O enhanced focused ion beam micromachining*, J. Vac. Sci. Technol. B 13(6), Nov./Dec., 1995, pp. 2585–2569.

Satoh, Y., et al., *Performance of gas assist FIB repair for opaque defects*, SPIE vol. 2884, 1996, pp. 124–137.

*Primary Examiner*—S. Rosasco
*Attorney, Agent, or Firm*—Dickstein Sharpiro Morin & Oshinsky LLP

[57] ABSTRACT

A method of repairing clear defects on a template such as a mask or reticle that includes the steps of directing a focused ion beam (FIB) to fill the clear defect with a carbon film and directing a FIB in the presence of a water containing gas to remove the carbon halo from around the clear defect repair area. The end of the carbon halo removal process may be detected by monitoring a change in the intensity of a secondary signal. The template is exposed to a basic solution to remove ion stains produced by the FIB. According to this method, clear defects are repaired and the carbon halo formed around the clear defect repair area of the template are removed.

38 Claims, 7 Drawing Sheets

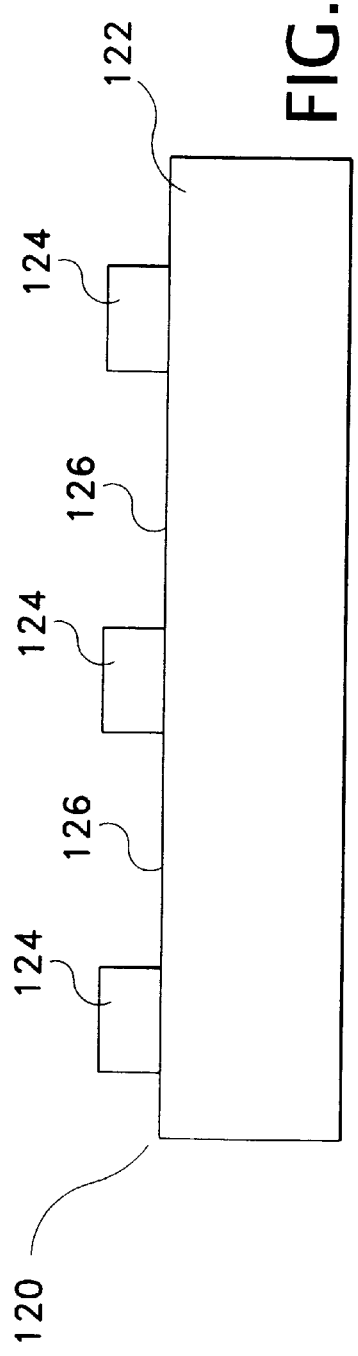
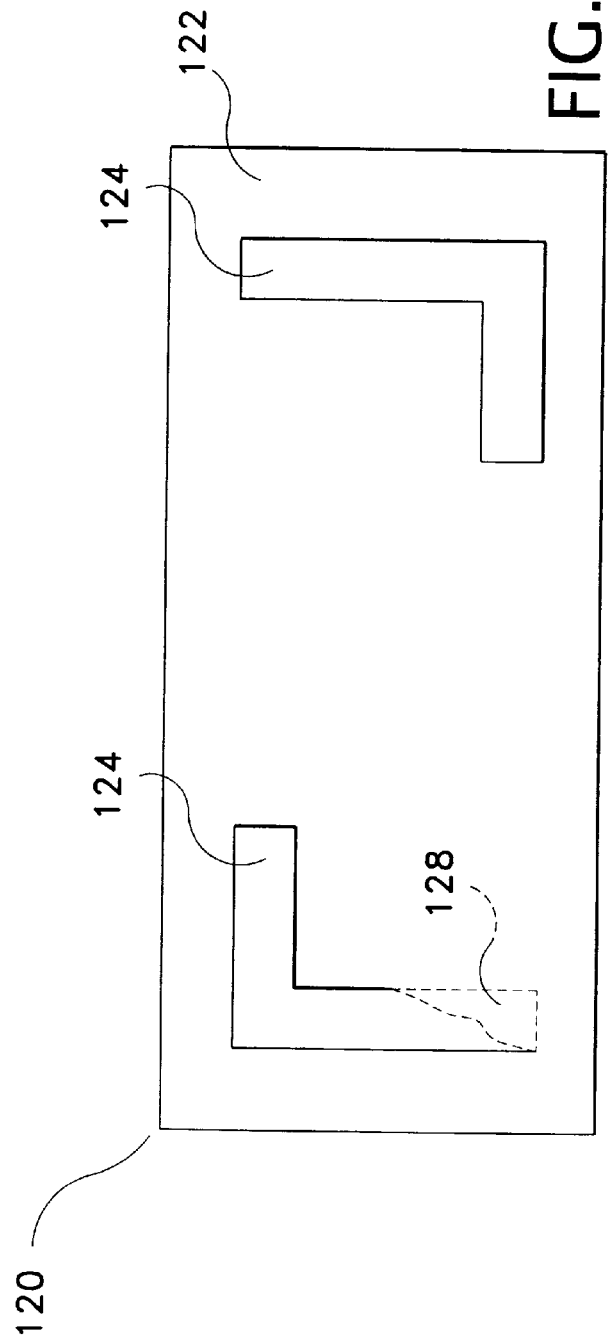

METHOD FOR REMOVING THE CARBON HALO CAUSED BY FIB CLEAR DEFECT REPAIR OF A PHOTOMASK

FIELD OF THE INVENTION

The present invention relates generally to a method for repairing a template used in optical lithography, and in particular to a method for removing the carbon halo caused by focused ion beam clear defect repair of a template, such as a mask or reticle, which is used in a lithographic process for the manufacture of semiconductor elements.

BACKGROUND OF THE INVENTION

In the manufacture of semiconductor wafers, microlithography is used to pattern various layers on a wafer. A layer of resist is deposited on the wafer and exposed using an exposure tool and a template such as a mask or reticle. During the exposure process a form of radiant energy, such as ultraviolet light, is directed through the template to selectively expose the resist in a desired pattern. The resist is then developed to remove either the exposed portions for a positive resist or the unexposed portions for a negative resist, thereby forming a resist mask on the wafer. The resist mask can then be used to protect underlying areas of the wafer during subsequent fabrication processes, such as deposition, etching, or ion implantation processes.

Manufacturers in the field of integrated circuits (ICs) have been trying to reduce the geometric size of the devices (e.g., transistors or polygates) present on integrated circuits. The benefits achieved by reducing device dimensions include higher performance and smaller packaging sizes. Improving lithographic techniques provides improved resolution and results in a potential reduction of the minimum dimension. However, at small geometries, diffraction effects such as proximity effects, poor subject contrast, and poor resolution result, producing wafers with incomplete or erroneous circuit patterns.

An individual reticle can cost up to $20,000 and typically requires up to two weeks to manufacture. Mask production likewise involves substantial time and expense. The complete circuit patterning for a modern IC will typically require 10 to 20 or more reticles, and the ability to modify or repair a reticle or mask quickly saves turnaround time and cost.

The most common template defects are pattern distortions of two types: opaque defects and clear defects. Reticles and masks typically consist of an opaque thin film of a metal, such as chromium, deposited in a pattern on a transparent substrate of quartz or glass. Opaque defects, which may occur as spots, pattern extensions, bridges between adjacent patterns, or the like, are the result of opaque material such as chromium or molybdenum silicide being present in a non-pattern area. Clear defects, which generally occur as pinholes, missing parts, or breaks in the pattern, are the result of missing or inadequate layers of opaque material in a pattern area on the template.

Focused ion beams (FIBs) have been used for repair of optical masks and reticles since the mid-1980s. The ability of the FIB to accurately remove unwanted portions of the metal film and to deposit material to "edit" the pattern makes it potentially an almost ideal repair tool. A FIB exposes a template to a beam of positively charged ions, typically gallium ions, via an optic system. When a template is exposed to the ion beam, secondary ions are produced, and may be detected by the FIB machine and monitored to determine the progress of repair work. If a chromium pattern is exposed, secondary chromium ions are generated, and if a silicon or glass pattern is exposed, secondary silicon ions are generated.

Sputtering with a scanning FIB is the preferred method of opaque defect repair at small geometries, but FIB sputtering has several disadvantages. First, difficulty in precisely determining the endpoint when etching may lead to overetching and subsequent recess formation in the template substrate. Second, the high energy (25 to 50 KeV) FIB beams used can cause significant template damage during repair due to the beam's high sputter rate. In addition, significant amounts of ions from the ion beam are implanted into the template substrate during imaging and opaque defect repair, resulting in an effect called "ion staining" or "gallium staining", when a gallium ion beam is used. This effect causes local reductions of the substrate's transparency which may print on the semiconductor wafer, and/or may be identified erroneously as defects by industry-standard mask inspection equipment.

The clear defects on a photomask have been traditionally repaired on a focused ion beam (FIB) tool by carbon deposition. However, a carbon halo was always found around the actual repair. This problem is more severe when the clear repair is done on a dense geometry semiconductor, e.g., a semiconductor structure designed using a 0.18 micron or less design rule. In a worst case scenario, the carbon halo can bridge the adjacent features causing the semiconductor formed using the mask to short out. In current production flows, the carbon halo present after clear repair is typically zapped on a DRS II laser repair tool. However, because of the limit of the optical resolution, the defect is very difficult to be reworked on DRS II when the feature size is less than 0.7 or 0.8 micron. No processes have been developed to remove the carbon halo on a FIB tool. As a result, many masks have to be rejected because of unrepairable carbon halo defects.

There is needed, therefore, a method of repairing clear defects on a template that reduces or prevents overetching, that reduces the carbon halo present after clear defect repair and that reduces damage caused by ion staining.

SUMMARY OF THE INVENTION

The present invention provides a method for repairing clear defects on a lithographic template by focused ion beam sputtering. The clear defect on a chromium mask is first repaired by FIB scanning to patch the clear defect (missing chromium) with a carbon film. However, it is impossible to perfectly replace the clear defect with a carbon film without leaving a carbon halo around the repair area. A second FIB process is then used to remove the carbon halo by sputtering gallium ions over the carbon halo in the presence of a water containing gas. A secondary signal, which may be a silicon ion signal, may be generated by the sputtering and monitored so that the sputtering process can be stopped as soon as the carbon halo has been removed and the substrate exposed. The template is then exposed to a strong base to remove ion stains from the template. The strong base may be sodium hydroxide, ammonium hydroxide or the like, but is preferably sodium hydroxide.

Additional advantages and features of the present invention will be apparent from the following detailed description and drawings which illustrate preferred embodiments of the invention.

BRIEF DESCRIPTION OF THE DRAWINGS

FIG. 3 is a cross-sectional view of a representative lithographic template.

FIG. 4 is a top view of a lithographic template undergoing the process of a preferred embodiment of the invention.

DETAILED DESCRIPTION OF PREFERRED EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention. The following detailed description is, therefore, not to be taken in a limiting sense, and the scope of the present invention is defined by the appended claims.

Figure 1:
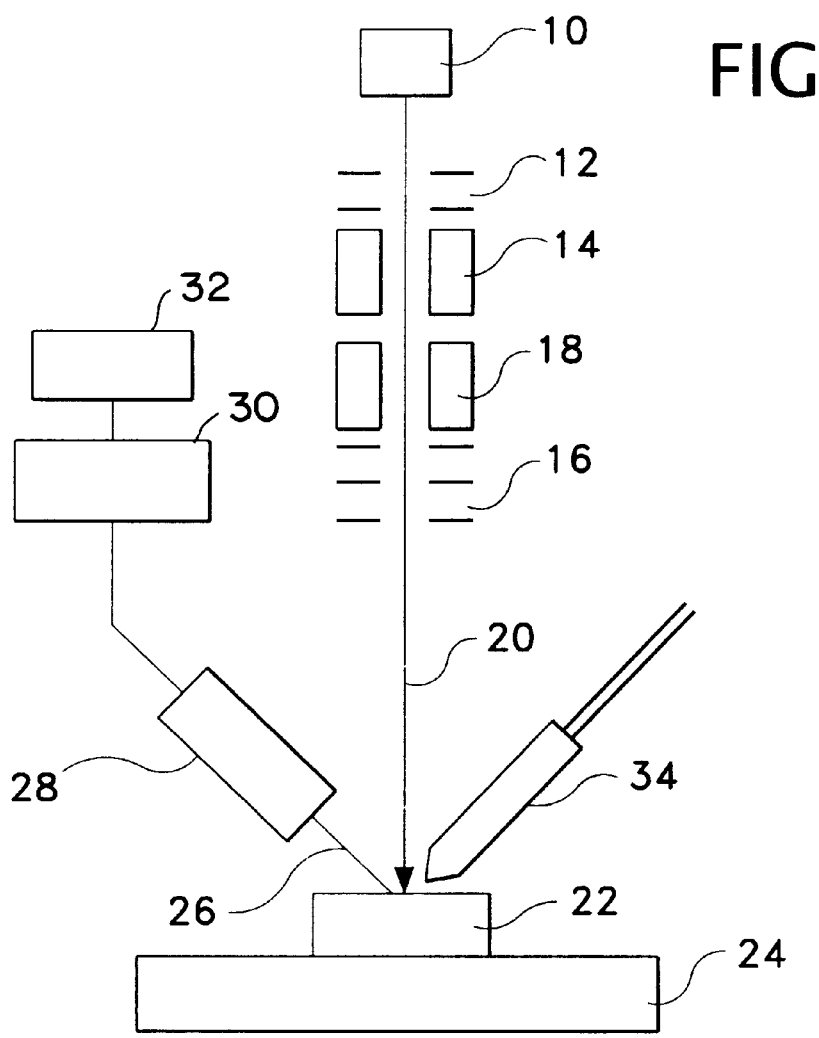
FIG. 1 shows a representative apparatus according to the present invention.

Referring now to the drawings, where like elements are designated by like reference numerals, FIG. 1 shows a representative apparatus for repairing a pattern film clear defect according to the present invention. An ion source 10 is provided for generating ions which may be, for example, a gallium ion beam. Ions generated from the ion source 10 pass through an ion optical system including a focusing lens 12 and an objective lens 16 and are formed into a focused ion beam 20. The focused ion beam 20 irradiates a sample 22 while scanning across a surface of the sample 22 by passing through the scanning electrode 18 which is connected to a voltage source. When the sample 22 is not undergoing irradiation with the scanning focused ion beam 20, a voltage is applied to the blanking electrode 14 so that the scanning focused ion beam 20 is deflected and, therefore, does not irradiate the surface of sample 22.

The sample 22 may be, for example, a photomask, a reticle, an X-ray mask or a semiconductor such as an IC and an LSI. Preferably, the sample 22 is a photomask comprising a transparent substrate of glass and a chromium pattern film formed on the substrate. Secondary charged particles 26 are emitted from the surface of the sample 22 when irradiated with the scanning focused ion beam 20. The secondary charged particles may be silicon ions generated from the substrate material or chromium ions generated from the pattern film material. A secondary charged particle detector 28 detects the secondary charged particles 26. The system is placed under a vacuum condition in which the pressure is preferably not more than $10^{-4}$ Torr. The sample 22 is placed on base 24 which is movable in both the X and Y directions. Thus, the base 24 can be moved to the desired position so that a portion of the pattern film of the sample 22 to be repaired comes within the focused ion beam scanning range.

An A/D converter 30 converts the secondary charged particle signals detected by the secondary charged particle detector 28. The output from the A/D converter 30 is displayed by an image display device 32. Patterns on the sample 22 can be displayed by synchronizing the scanning of the focused ion beam 20 with the display of the scan by means of the image display device 32.

Figure 2:
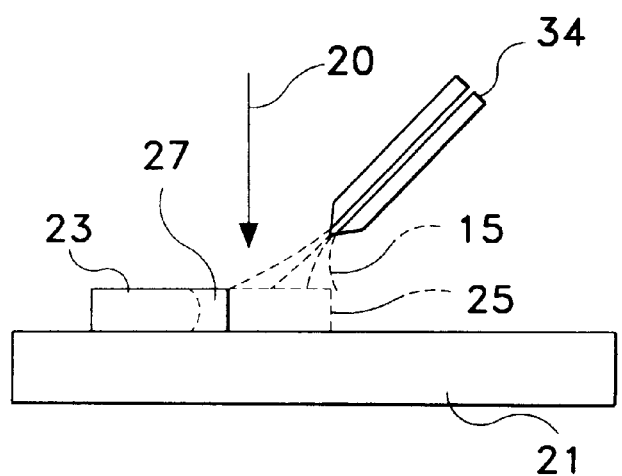
FIG. 2 is a sectional view for illustrating a defect repair.

FIG. 2 illustrates a sectional view of an example of the repair of a clear defect on a photomask. The mask illustrated in FIG. 2 has already had the clear defect filled with a carbon film 27. The sample 22 comprises a glass substrate 21 and a pattern film 23 of chromium or molybdenum silicide having an excess portion 25 which is a carbon halo. The pattern film 23 and the carbon halo 25 around the film 27 are formed on the glass substrate 21. The carbon halo 25 of the pattern film 23 is to be removed by means of the present apparatus. In removing the carbon halo 25, the range of scanning of the focused ion beam is set to correspond to the carbon halo 25 and the scanning focused ion beam 20 is irradiated only on the carbon halo 25 of the carbon film 27. A water containing gas 15, which is preferably water vapor, is locally directed onto the carbon halo 25 through a nozzle 34. Nozzle 34 may introduce a water containing gas as an etch gas for chemically assisted opaque defect repair or carbon halo removal. The nozzle 34 may also inject an organic gas into the reaction area for sputtering a carbon film over the clear defect. The organic gas may also be injected into the reaction area by a separate nozzle (not shown). The organic gas is preferably a hydrocarbon gas such as, for example, pyrene, styrene, or the like.

The water containing gas 15 has a smooth surface etching effect on the repaired portion of the clear defect and operates such that residues from the process such as gallium are minimized, since the water containing gas 15 adsorbes on the substrate 21 and prevents the gallium ions from bombarding the substrate 21. Further, the water containing gas 15, at the carbon halo 25, is activated by the focused ion beam 20 and reacts with the material of the carbon halo 25 to form carbon monoxide and carbon dioxide. Thus, removal of the carbon halo 25 is increased and gallium material deposition from the FIB is inhibited around the carbon halo 25, since the material removed from the carbon halo 25 reacts with the water containing gas. Since the water containing gas 15 outside of the carbon halo 25 is not irradiated with the focused ion beam 20, the water containing gas 15 residing outside the carbon halo 25 is not activated by focused ion beam 20 and does not react with the material of the pattern film. While not wishing to be bound by theory, it is believed that the water containing gas 15 forms a monolayer on the mask surface to protect the mask surface from damage from the focused ion beam 20. Therefore, the removal of the carbon halo 25 can be achieved cleanly and completely. The mask is then processed in a wet bath for about two minutes as further described below.

The gas injector illustrated in FIG. 1 includes a nozzle 34 for directing the water containing gas 15 onto the excess portion of the photomask. The apparatus may include elements known to the person having ordinary skill in the art to provide a water containing gas 15 to the apparatus at a predetermined pressure and a predetermined flow rate. In this regard, U.S. Pat. No. 4,851,097 is herein incorporated by reference. The optimum pressure of the water containing gas of the present invention is from about $0.5 \times 10^{-5}$ Torr to about $5.0 \times 10^{-5}$ Torr, most preferably about $1.5 \times 10^{-5}$ Torr.

Reference is now made to FIG. 3. An exemplary lithographic template 120 is shown in FIG. 3. The lithographic template 120 may be a photomask, x-ray mask, reticle, or other similar structure having similar features. The lithographic template comprises a transparent substrate 122, a light translucent portion 124 formed and patterned on the transparent substrate 122, and a light transmitting portion 126. The transparent substrate 122 is made of silica glass, borosilicate glass, quartz, or the like, and is typically a 6 by 6 inch square having a thickness of approximately 0.25 inches, although the size and thickness may vary. The light translucent portion 124 comprises a thin film made of a material containing a metal, and which may additionally contain silicon, oxygen and/or nitrogen. The metal may be chromium, molybdenum, tantalum, tungsten, or other similar element or compound. For exemplary purposes, the light translucent portion 124 is described as being a chromium film.

Figure 5:
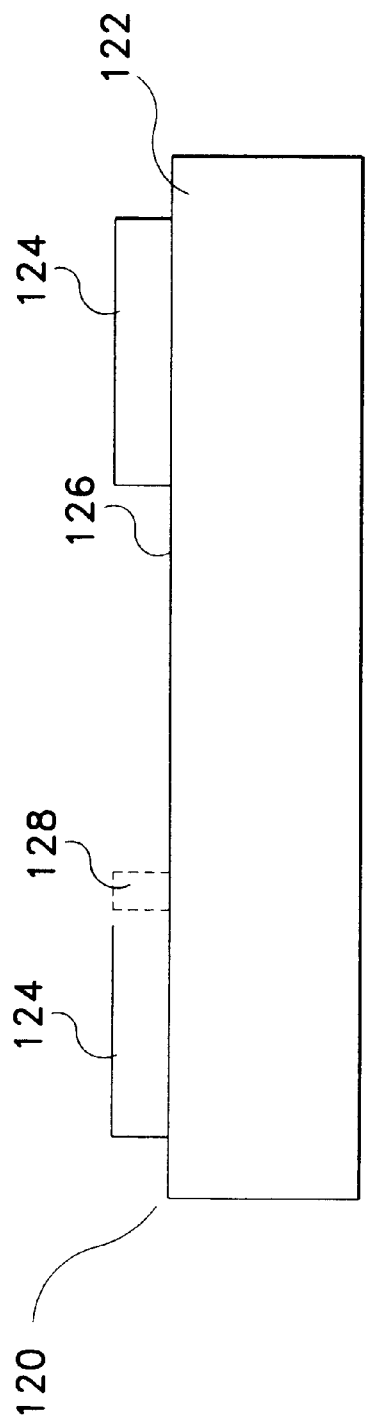
FIG. 5 is a side view of the template of FIG. 4.

A lithographic template 120 having a clear defect 128 therein is shown in FIGS. 4 and 5. The clear defect 128 is indicated in dashed lines in the light translucent portion 124. To remove the clear defect, the template 120 is placed in the vacuum chamber (not shown) of a FIB system. Any suitable FIB system as described above may be utilized, additionally, commercial embodiments are those such as a Seiko SIR-3000 system manufactured by Seiko Instrument Inc., or a Micrion 8000 system manufactured by Micrion, Inc. Such systems typically have an irradiation energy within the range of 25 to 30 KeV, and a beam current of approximately 45 to 300 pA. The chamber is evacuated, and the FIB is operated in a non-critical area to determine the secondary ion signal level corresponding to the desired endpoint.

Figure 6:
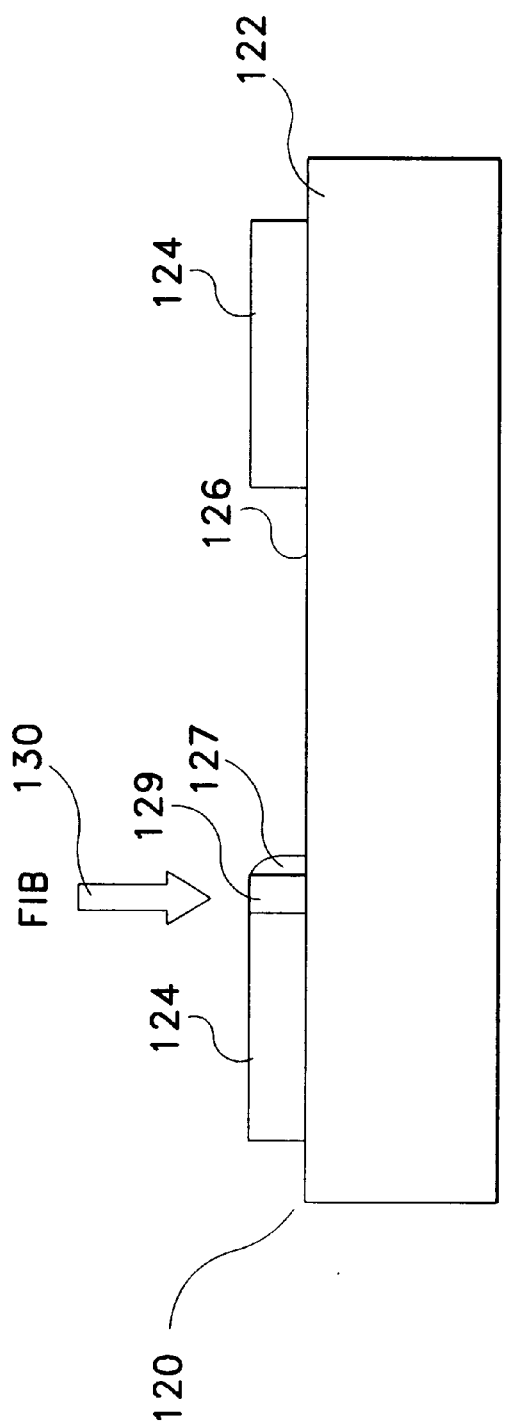
FIG. 6 shows the template of FIG. 5 at a processing step subsequent to that shown in FIGS. 4 and 5.

Referring now to FIG. 6, the ion beam 130 is focused and scanned on the clear defect 128 while introducing an organic gas into the reaction chamber and sputtering is begun. The clear defect 128 is patched with a carbon film to replace the clear defect 128 in the light translucent portion 124 with a carbon film layer 129. However, since it is impracticable to exactly replace the missing chromium in the light translucent portion 124 with the carbon film 129, an additional carbon halo 127 is also present when repairing the clear defect 128.

Figure 7:
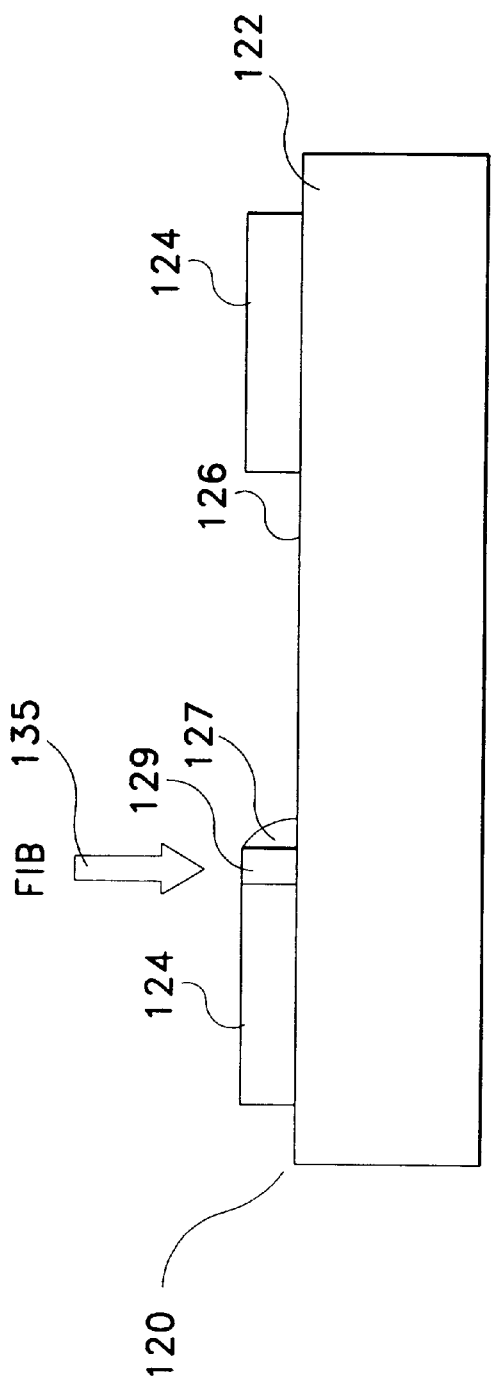
FIG. 7 shows the template of FIG. 5 at a processing step subsequent to that shown in FIG. 6.
Figure 8:
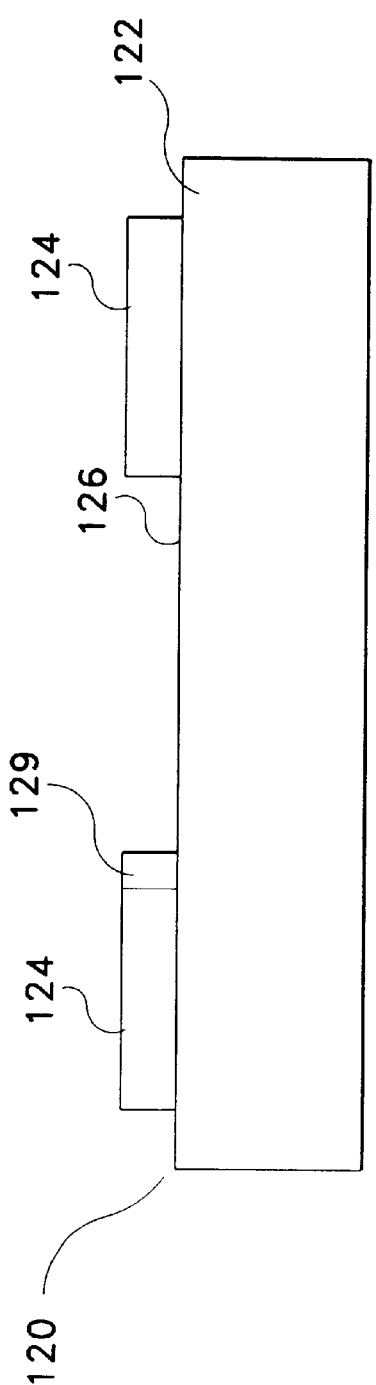
FIG. 8 shows the template of FIG. 5 at a processing step subsequent to that shown in FIG. 7.

Referring now to FIG. 7, the ion beam 135 is focused on the carbon halo 127, and sputtering is begun, preferably with a gallium beam 135 in the presence of a water containing gas (not shown) as described above. The secondary ion signal level, as described above, is monitored simultaneously with the sputtering process, so that when the signal level corresponding to the desired endpoint is detected, sputtering may be immediately halted. As shown in FIG. 8, the carbon halo is no longer present on the template 120. However, an ion stain (not shown) may be present on the template 120, and may result in a phase error and reduced transmission in the light transmitting portion 126.

Any ion stains are then removed by exposing the template to an aqueous solution of a strong base. Suitable bases include sodium hydroxide, potassium hydroxide, ammonium hydroxide, tetramethyl ammonium hydroxide, and the like. Preferably, sodium hydroxide is used. The solution should comprise approximately 3 to 4 percent sodium hydroxide in water, or should be of an equivalent strength if another base is used. The sodium hydroxide solution is heated to a temperature of approximately 80 degrees Celsius, and the template is exposed thereto for a period of time within the range of approximately 1 to 5 minutes. Preferably the exposure time should be approximately 2 minutes, but it should be understood that the exposure time will vary according to the strength of the basic solution utilized. After the exposure step, the ion stain has been removed.

Figure 9:
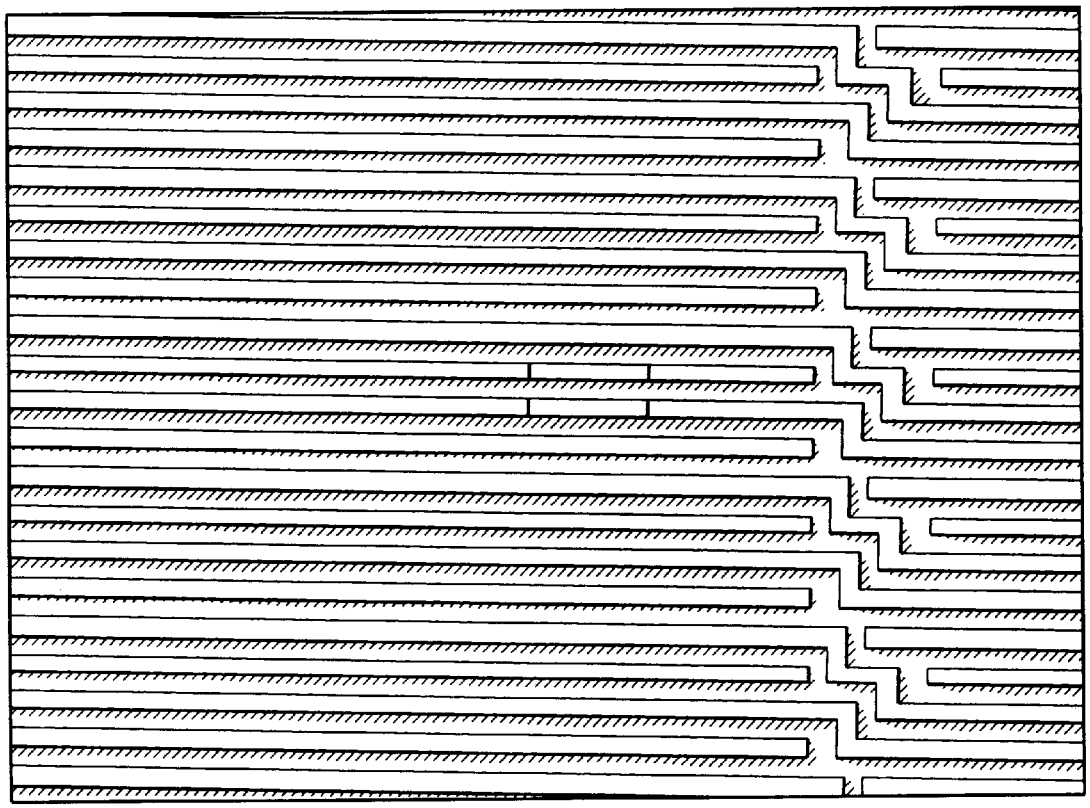
FIG. 9 illustrates a reflected microscope image of two clear repairs on a 1.0 micron line/space pattern.
Figure 10:
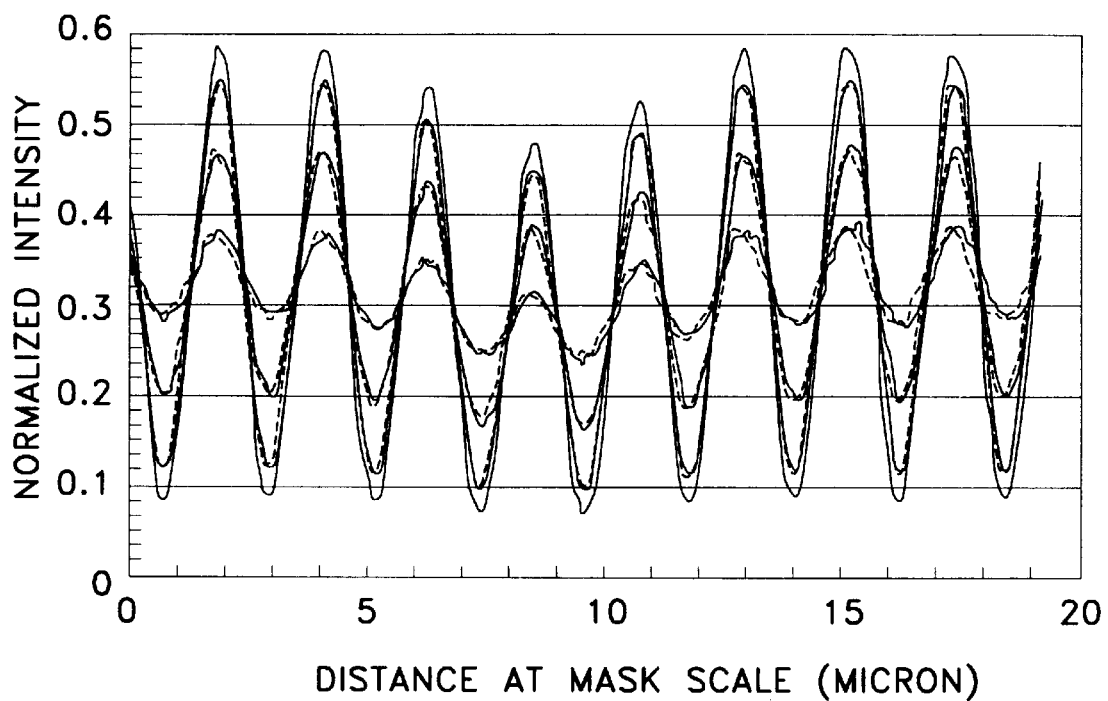
FIG. 10 shows the intensity profile crossing the clear repair area of a mask where the carbon halo was not removed.
Figure 11:
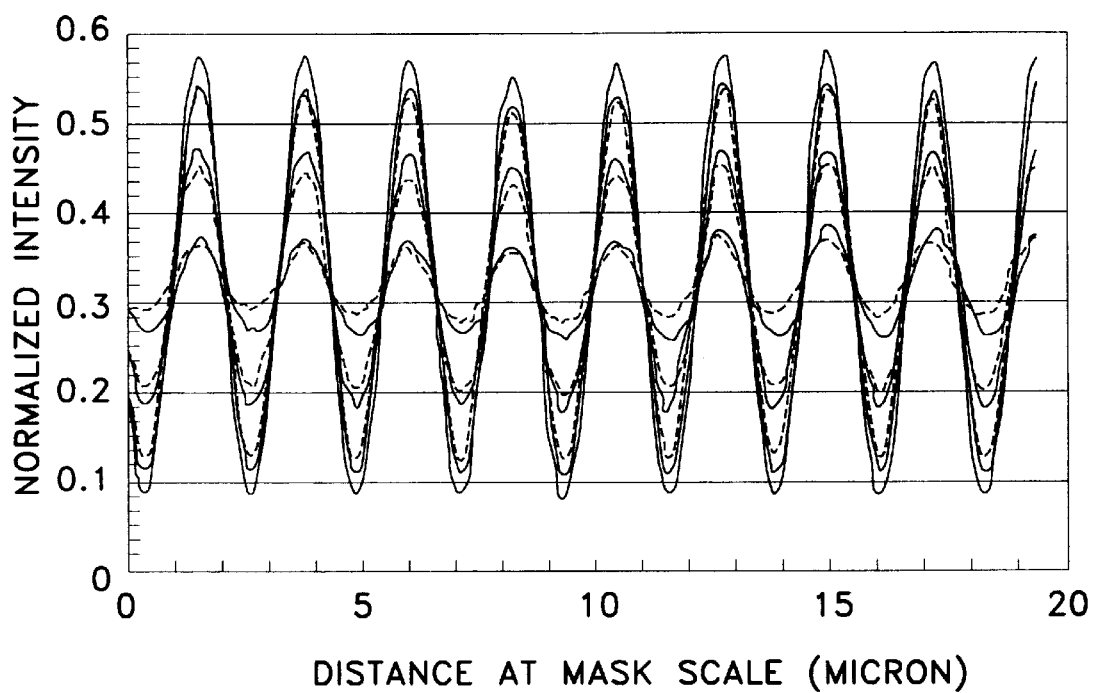
FIG. 11 shows the intensity profile crossing the clear repair area of a mask where the carbon halo was removed according to the present invention.

FIG. 9 shows a reflected microscope image of two clear repairs on 1.0 micron line/space patterns according to the present invention. As can be seen in this figure, the lines are clearly repaired and there is no carbon halo evident along the longitude of the repaired defects. Reference is now made to FIGS. 10 and 11. These figures show the intensity profile across the repair area by taking an aerial image on a Carl Zeiss MSM-100 AIMS tool. As seen in the figures, there are seven curves illustrated in the intensity profile. The maximum curve is the profile on the correct focus intensity and the other curves are taken at different focuses. FIG. 10 shows the intensity profile across the repair area according to the prior art where the carbon halo is not removed. The image was taken at 248 nm wavelength. As can be seen from the figure, at the center of the graph (between about 6.0 and about 12.0 microns at mask on the x-axis) the intensity profile plot shows a lessened intensity. This corresponds to a carbon halo formed on the clear defect repair area. According to the figure, a maximum of 18% transmission loss was found between the two patches.

FIG. 11 shows an intensity profile after removing the carbon halo according to the method of the present invention. As can be seen from the figure, the intensity profile plot is generally consistent. This figure indicates the removal of the carbon halo from the clear defect repair. When following the method according to the present invention only a 4% transmission loss was measured after removal of the carbon halo. As can be seen by the embodiments described herein, the present invention encompasses a clear defect repair method for a lithographic template. The method uses carbon film deposition, followed by focused ion beam sputtering in combination with a water containing gas, and treatment with a strong base such as sodium hydroxide to remove ion stains. This process has the advantage of avoiding overetching, reduces the carbon halo present in the clear defect repair and reduces the undesirable effects of ion stains caused by the FIB process.

The above description and drawings illustrate preferred embodiments which achieve the objects, features and advantages of the present invention. It is not intended that the present invention be limited to the illustrated embodiments. Any modification of the present invention which comes within the spirit and scope of the following claims should be considered part of the present invention.

What is claimed as new and desired to be protected by Letters Patent of the United States is:

1. A method for removing a clear defect from a lithographic template comprising the steps of:
   providing a lithographic template having a substrate layer and a patterned metal layer on the substrate layer;
   removing a clear defect by directing a focused ion beam at the template in the presence of an organic gas to deposit a carbon film thereon; and
   removing a carbon halo from around said clear defect repair by directing the focused ion beam at the carbon halo in the presence of a water containing gas.

2. The method according to claim 1, wherein the metal is chromium.

3. The method according to claim 1, further comprising monitoring a secondary signal obtained from said template during said carbon halo removal step.

4. The method according to claim 3, wherein the secondary signal is monitored by detecting a change in the intensity of said signal and stopping said removal step upon determining a change in the intensity of said secondary signal.

5. The method according to claim 1, further comprising exposing the template to a basic solution.

6. The method according to claim 5, wherein the basic solution is a sodium hydroxide solution.

7. The method according to claim 5, wherein the basic solution is an ammonium hydroxide solution.

8. The method according to claim 5, wherein the basic solution is a potassium hydroxide solution.

9. The method according to claim 5, wherein the basic solution is a tetramethyl ammonium hydroxide solution.

10. The method according to claim 1, wherein the lithographic template is a mask.

11. The method according to claim 1, wherein the lithographic template is a reticle.

12. The method according to claim 1, wherein said water containing gas is water vapor.

13. The method according to claim 1, wherein said focused ion beam is a gallium beam.

14. The method according to claim 1, wherein said organic gas is a hydrocarbon gas.

15. The method according to claim 14, wherein said hydrocarbon gas is pyrene.

16. A method for repairing a lithographic template by removing a clear defect comprising the steps of:

providing a lithographic template having a substrate layer and a patterned metal layer on the substrate layer;

removing said clear defect by directing a first focused ion beam at the template in the presence of an organic gas to deposit a carbon film thereon;

removing a carbon halo from said clear defect repaired area by directing a second focused ion beam in the presence of a water containing gas at the template while monitoring a silicon ion signal obtained from the template; and stopping said carbon halo removal step upon determining that the silicon ion signal indicates that the substrate layer of the template is exposed.

17. The method of claim 16, wherein said metal is chromium.

18. The method according to claim 16, further comprising exposing the template to a sodium hydroxide solution.

19. The method of claim 18, wherein said exposure step is carried out for a time within the range of approximately 1 to 5 minutes.

20. The method of claim 19, wherein the time is approximately 2 minutes.

21. The method of claim 18, wherein the sodium hydroxide solution comprises approximately 3 to 4 percent sodium hydroxide in water.

22. The method of claim 21, wherein the sodium hydroxide solution is at a temperature of approximately 80 degrees Celsius.

23. The method of claim 16, wherein the lithographic template is a mask.

24. The method of claim 16, wherein the lithographic template is a reticle.

25. The method according to claim 16, wherein said water containing gas is water vapor.

26. The method according to claim 16 wherein said second focused ion beam is a gallium beam.

27. The method according to claim 16 wherein said organic gas is a hydrocarbon gas.

28. The method according to claim 27 wherein said hydrocarbon gas is pyrene.

29. A method for repairing a lithographic template by removing a clear defect comprising the steps of:

providing a lithographic template having a substrate layer and a patterned chromium layer on the substrate layer;

removing said clear defect by directing a first focused ion beam at the template in the presence of a hydrocarbon gas to deposit a carbon film thereon;

removing a carbon halo from said clear defect repaired area by directing a second focused ion beam in the presence of water vapor at the template until a secondary silicon ion signal obtained from the template indicates that the substrate layer of the template is exposed;

exposing the template to a sodium hydroxide solution.

30. The method of claim 29, further comprising a step of repairing an opaque defect by directing a focused ion beam at said opaque defect, wherein said opaque defect removal step is performed prior to said solution exposure step.

31. The method of claim 29, wherein the sodium hydroxide solution comprises approximately 3 to 4 percent sodium hydroxide in water.

32. The method of claim 31, wherein said exposure step is carried out for a time within the range of approximately 1 to 5 minutes.

33. The method of claim 32, wherein the time is approximately 2 minutes.

34. The method of claim 29, wherein the sodium hydroxide solution is at a temperature of approximately 80 degrees Celsius.

35. The method of claim 29, wherein the lithographic template is a mask.

36. The method of claim 29, wherein the lithographic template is a reticle.

37. The method according to claim 29, wherein said second focused ion beam is a gallium beam.

38. The method according to claim 29, wherein said hydrocarbon gas is pyrene.

* * * * *